US010468974B2

(12) United States Patent
Lee et al.

(10) Patent No.: US 10,468,974 B2
(45) Date of Patent: Nov. 5, 2019

(54) METHOD AND APPARATUS OF DEAD TIME TUNING IN AN INVERTER

(71) Applicant: Hong Kong Applied Science and Technology Research Institute Company Limited, Hong Kong (CN)

(72) Inventors: Hang Sang Lee, Hong Kong (CN); Yan Liu, Hong Kong (CN)

(73) Assignee: HONG KONG APPLIED SCIENCE AND TECHNOLOGY RESEARCH INSTITUTE COMPANY LIMITED, Hong Kong (CN)

( * ) Notice: Subject to any disclaimer, the term of this patent is extended or adjusted under 35 U.S.C. 154(b) by 0 days.

(21) Appl. No.: 16/254,633

(22) Filed: Jan. 23, 2019

(65) Prior Publication Data
US 2019/0157970 A1 May 23, 2019

Related U.S. Application Data

(63) Continuation-in-part of application No. 15/459,003, filed on Mar. 15, 2017, now Pat. No. 10,230,311.

(51) Int. Cl.
*H02M 1/32* (2007.01)
*H02M 1/38* (2007.01)
*G01K 7/34* (2006.01)
*H02M 7/5387* (2007.01)

(52) U.S. Cl.
CPC ............... *H02M 1/32* (2013.01); *G01K 7/34* (2013.01); *H02M 1/38* (2013.01); *H02M 7/53871* (2013.01); *H02M 2001/385* (2013.01)

(58) Field of Classification Search
CPC ... H02M 7/537; H02M 1/32; H02M 2001/237
See application file for complete search history.

(56) References Cited

U.S. PATENT DOCUMENTS

| 7,400,163 | B2 * | 7/2008 | Yanagigawa | ........... H02M 1/38 |
| | | | | 323/282 |
| 7,456,620 | B2 * | 11/2008 | Maksimovic | ........... H02M 1/38 |
| | | | | 323/246 |
| 9,548,654 | B2 | 1/2017 | Yi et al. | |
| 10,044,347 | B2 | 8/2018 | Abesingha et al. | |
| 2018/0131282 | A1 * | 5/2018 | Chen | ........... H03K 5/1515 |

FOREIGN PATENT DOCUMENTS

| CN | 103516246 | | 1/2014 |
| JP | 2003033048 | | 1/2003 |
| JP | 3594528 | B2 * | 12/2004 |

* cited by examiner

*Primary Examiner* — Gary L Laxton
*Assistant Examiner* — Lakaisha Jackson
(74) *Attorney, Agent, or Firm* — Eagle IP Limited; Jacqueline C. Lui (57) ABSTRACT

A method that prevents overload to input source and reduces parasitic inductance in an inverter circuit with dead-time control. A sensing capacitor senses temperatures of transistors in the inverter circuit. A delay generator changes delay times in response to receiving the temperatures of the transistors from the sensing capacitor. A dead time generation unit changes the dead times for the transistors in response to changes in the delay times.

20 Claims, 6 Drawing Sheets

METHOD AND APPARATUS OF DEAD TIME TUNING IN AN INVERTER

CROSS-REFERENCE TO RELATED APPLICATION

This application is a continuation-in-part application of U.S. Non-provisional application Ser. No. 15/459,003 filed on 15 Mar. 2017, which is hereby incorporated by reference herein in its entirety for all purposes.

FIELD OF INVENTION

The present invention relates to methods and apparatus that prevent shoot-through current and reduce body-diode conduction time of power devices in an inverter circuit by changing dead times.

BACKGROUND OF INVENTION

Power inverters are electronic devices or circuits that change direct current (DC) into alternating current (AC). Inverters play an important role in modern electronics and have wide applications that include uninterruptible power supplies, solar power, induction heating, wireless power transfer, and many other technologies. Unfortunately, some inverters are subject to shoot-through current which can cause a myriad of problems.

New methods and systems that prevent shoot-through current and reduce body-diode conduction time in inverters will assist in advancing technological needs and solving technological problems.

SUMMARY OF INVENTION

One example embodiment is a method that prevents overload to input source and reduces parasitic inductance in an inverter circuit with dead-time control. The method includes sensing temperatures of a high side device in the inverter circuit with a first sensing capacitor, sensing temperatures of a low side device in the inverter circuit with a second sensing capacitor, changing first dead time intervals by a first delay generator and in response to receiving the temperatures from the first sensing capacitor; changing second dead time intervals by a second delay generator and in response to receiving the temperatures from the second sensing capacitor; preventing overload to the input source and reducing parasitic inductance by connecting the first sensing capacitor between an output of the first delay generator and a ground, and connecting the second sensing capacitor between an output of the second delay generator and the ground. The first dead time intervals correspond to dead times before the high side device is turned on. The second dead time intervals correspond to dead times before the low side device is turned on. The deadtime control includes generating dead times based on the first dead time intervals and the second dead time intervals.

Another example embodiment is an inverter circuit that prevents overload to input source and reduces parasitic inductance in the inverter circuit. The inverter circuit includes a first sensing capacitor that is thermally connected to a high side device in the inverter circuit, a second sensing capacitor that is thermally connected to a low side device in the inverter circuit, a dead times generation unit that prevents shoot-through currents and reduces body-diode conduction time by generating dead times including first dead time intervals and second dead time intervals for the high side device and the low side device respectively. The dead times generation unit includes a first delay generator that changes the first dead time intervals and a second delay generator. The first sensing capacitor is connected between an output of the first delay generator and a ground. The second sensing capacitor is connected between an output of the second delay generator and the ground. The first dead time intervals correspond to dead times before the high side device is turned on, and the second dead time intervals correspond to dead times before the low side device is turned on.

Another example embodiment is a method that prevents overload to input source and reduces parasitic inductance in an inverter circuit with deadtime control. The method includes sensing temperatures of at least one high side device in the inverter circuit and temperatures of at least one low side device in the inverter circuit; changing first dead time intervals and second dead time intervals with at least one dead times generation unit and in response to receiving the temperatures of the at least one high side device and the temperatures of the at least one low side device; and preventing shoot-through currents and reducing body-diode conduction time by operating the inverter circuit with dead times within a maximum dead time and a minimum dead time. First dead time intervals correspond to dead times before the at least one high side device is turned on and second dead time intervals that correspond to dead times before the at least one low side device is turned on. The maximum dead time depends on a capacitance of at least one sensing capacitor at a rated temperature and the minimum dead time depends on the capacitance of the at least one sensing capacitor at Curie temperature.

Other example embodiments are discussed herein.

DETAILED DESCRIPTION

As used herein, a "body-diode conduction time" is a period that the current flows via the high-resistive parasitic body-diode path paralleled with the device channel when the channels of high side and low side devices in the power inverters are both off, e.g. dead time intervals.

As used herein and in the claims, "comprising" means including the following elements but not excluding others.

As used herein, a "Curie temperature" is a threshold temperature at which the positive temperature coefficient material changes its characteristics, e.g. capacitance sharp increase. The characteristic of Curie temperature is utilized to limit the maximum current of power devices, hence prevent shoot through current.

As used herein, connection by one wire or conductor strip "only" refers to direct connection between the sensing capacitor and the delay generator.

As used herein, "dead times generation unit" is a circuit that inserts dead times into a pulse width modulator (PWM) signal so, for example, conduction in two or more power transistors in a half-bridge or a full-bridge does not overlap.

As used herein, "device", "high side device", "low side device" are power transistors in an inverter circuit.

As used herein, an "inverter circuit" is an electronic circuitry that changes direct current (DC) to alternating current (AC).

As used herein, "printed circuit board (PCB) trace" is a conductor strip that enable current flow to and from integrated circuit. The PCB consists of a network of integrated circuits interconnected by PCB traces.

As used herein, "shoot-through current" is a rush of current that occurs while both devices in an inverter circuit are on, and "shoot-through" refer to a current flow from Vamp to the ground through both devices in an inverter circuit.

As used herein, "overshoot" means the transitory values exceed ideal value and "undershoot" means the transitory values are lower than the ideal value. The ideal value is the load voltage in a perfectly matched condition. Both "overshoot" and "undershoot" occur during transience, which is a short duration of time when the signal is ringing or oscillating at a mismatched load.

Example embodiments relate to apparatus and methods that prevent overload to input source and reduces parasitic inductance in an inverter circuit with deadtime control.

Power inverters (or inverters) are electronic devices or circuits that convert direct current (DC) to alternating current (AC). Inverters are widely used in different applications, e.g. induction heating, power amplifiers, uninterruptible power supplies, and many other applications. One type of an inverter, known as a Class-D inverter, is used in wireless power transfer systems because the inverter has higher efficiency, is more robust to load variation, and provides higher output power.

With a Class-D inverter and other inverters, it is important to avoid a situation that occurs when high side devices and low side devices in the inverter circuit are on simultaneously. This situation creates a low-resistance path and generates large shoot-through currents. For example, shoot-through current occurs when two power devices are both either fully or partially on which provides a path for a large surge of current to shoot through from $V_{IN}$ to the ground GND. In consequence, the devices in the inverter circuit heat up and waste power or even become damaged.

One way to mitigate or eliminate shoot-through current is with a dead time generator or dead times generation unit. This generator creates time delays between the inputs of devices to avoid shoot-through currents. The time intervals in which both devices are off are called dead times.

When the inverter is in desired operation, the inputs of devices should not be high on the same time. For example, when an input A for driving the high side device (e.g., transistor 1) is on, an input B for driving the low side device (e.g., transistor 2) is off, and vice versa. Nonetheless, when the input A and the input B are in a switching stage, the devices may run into undesired operation. Thus, there is a short period of time where both devices are in the "on" stage and a short circuit occurs. During dead times, both the input A and the input B are at the "off" stage.

When the dead time $T_D$ is equal to a predetermined critical time $T_{crit}$, there is no power loss in the circuit. When $T_D$ is less than zero, shoot-through currents occur. When $T_D$ is greater than or equal to zero and less than $T_{crit}$, there is some switching loss in the circuit. When $T_D$ is greater than $T_{crit}$, negative current causes body-diode conduction.

Example embodiments solve the above-stated problems by providing technical solutions in dead times generation with new methods and apparatus that prevent shoot-through currents and reduce body-diode conduction time in an inverter circuit. In particular, generation of dead times in example embodiment is not restricted to generating one fixed dead time which is only suitable for one loading condition.

Example embodiments include methods and apparatus that change the length of dead times to avoid device breakdown, inefficiency in power conversion, overheat of device, increase in system operating temperature and driver malfunction caused by serious undershoot voltage. Example embodiments also mitigate or eliminate shoot-through currents that occur in inverter circuits, including Class-D inverter circuits.

Example embodiments benefit the operations of inverter circuits and increase the efficiency in the converting DC to AC which is useful in many different electronic devices and applications.

By way of example, the efficiency of power devices with high body-diode forward bias voltage (such as enhancement mode GaN HEMTs) is seriously affected by dead time length. The device temperature is proportional to power loss of these power devices. The optimal dead time value for the inverters achieves the minimal power loss in terms of minimal device temperature detected. Example embodiments provide methods and apparatus that automatically adjust dead times and maintain the inverter circuit at the optimal dead time value.

Example embodiments of the present invention prevent overload to input source, thereby the present invention is suitable for low voltage and high driving current applications with simplified circuit design.

In electrical networks, a parasitic element is a circuit element that is possessed by an electrical component and it is not desirable for it to have for its intended purpose. A wire has parasitic inductance as any wires that has current flowing through it creates magnetic field around itself. The parasitic inductance is determined by the length of trace and the operating frequency. The length of trace longer, the parasitic inductance is higher. For an inverter circuit that has a deadtime control, parasitic inductance can have a significant impact on how effective the control is. If such circuit experiences high parasitic inductance, in the event of a false signal the voltage could be allowed to overshoot dramatically and not protect the components at all. Example embodiments reduce parasitic inductance of circuit wiring.

Different loading needs to control different deadtime in order to achieve optimum efficiency in an inverter circuit. Example embodiments can achieve self-optimal deadtime control setting according to device temperature.

As a further benefit, example embodiments reduce material cost in purchasing higher grading components and operating cost for large heat sinks and space. For example, the example embodiments reduce the importance of implementation of heat sink in an inverter circuit and remove the requirement of expensive cooling components in the inverter circuit.

Figure 1:
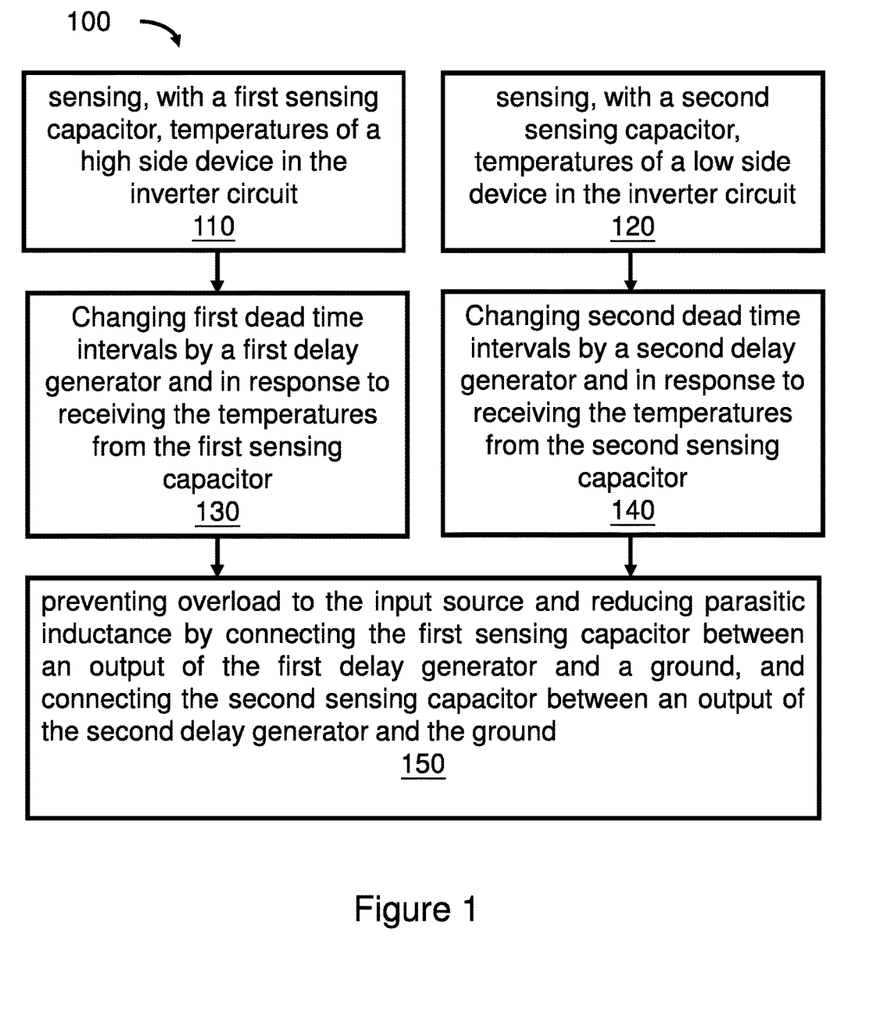
FIG. 1 shows a method that prevents overload to input source and reduces parasitic inductance in an inverter circuit with dead-time control in accordance with an example embodiment.

Referring now to FIG. 1, example embodiment includes a method that prevents overload to input source and reduces parasitic inductance in an inverter circuit with dead-time control.

By way of example, the deadtime control includes generating dead times based on first dead time intervals and second dead time intervals. For example, the first dead time intervals correspond to dead times before the high side device is turned on, and the second dead time intervals correspond to dead times before the low side device is turned on.

Block 110 illustrates sensing, with a first sensing capacitor, temperatures of a high side device in the inverter circuit.

By way of example, the first sensing capacitor thermally connects to the high side device through a metal wire or any heat conducting materials.

By way of example, the high side device is enclosed in or thermally connected to a heat sink, and the first sensing capacitor is also enclosed in or thermally connected to the heat sink.

Block 120 illustrates sensing, with a second sensing capacitor, temperatures of a low side device in the inverter circuit.

By way of example, the second sensing capacitor thermally connects to the low side device through a metal wire or a heat conducting material.

By way of example, the low side device is enclosed in or thermally connected to a heat sink, and the second sensing capacitor is also enclosed in or thermally connected to the heat sink.

By way of example, the high side device and low side device can be selected from one or more types of transistor, including but not limited to enhancement mode GaN, GaN power transistors, and MOSFETs. There are high power-density devices that result in obvious temperature variations.

By way of example, a source voltage connects to a drain of the high side device. A source of the high side device connects to a drain of the low side device. A source of the low side device connects to the ground.

Block 130 illustrates changing the first dead time intervals by a first delay generator and in response to receiving the temperatures from the first sensing capacitor.

For example, the capacitances of the first sensing capacitor change in response to detecting or sensing the temperatures of the high side device. The first delay times generated from the first delay generator automatically change in response to changes in the capacitances of the first sensing capacitor. These changes occur continually or continuously in real-time as the sensed temperature of the high device changes. The first dead time intervals change in response to changing the first delay times generated by a RC delay. R is the resistance of a first fixed value resistor inside a dead times generation unit including the first delay generator and the second delay generator. C is the capacitance of the first sensing capacitor.

Block 140 illustrates changing the second dead time intervals by a second delay generator and in response to receiving the temperatures from the second sensing capacitor.

For example, the capacitances of the second sensing capacitor change in response to detecting or sensing the temperatures of the low side device. The second delay times generated from the second delay generator automatically change in response to changes in the capacitances of the second sensing capacitor. These changes occur continually or continuously in real-time as the sensed temperature of the low device changes. The second dead time intervals change in response to changing the second delay times generated by a R'C' delay. R' is the resistance of a second fixed value resistor inside the dead times generation unit. C' is the capacitance of the second sensing capacitor.

Block 150 illustrates preventing overload to the input source and reducing parasitic inductance by connecting the first sensing capacitor between an output of the first delay generator and a ground, and connecting the second sensing capacitor between an output of the second delay generator and the ground.

By way of example, the first fixed value resistor is connected between an input and the output of the first delay generator.

By way of example, the second fixed value resistor is connected between an input and the output of the second delay generator.

By way of example, the first delay generator connects with the first sensing capacitor by one wire or conductor strip only.

By way of example, the second delay generator connects with the second sensing capacitor by one wire or conductor strip only.

By way of example, the first sensing capacitor includes a first negative temperature coefficient capacitor and a first positive temperature coefficient capacitor that are serially connected, the second sensing resistor includes a second negative temperature coefficient capacitor and a second positive temperature coefficient capacitor that are serially connected.

By way of example, the first negative temperature coefficient capacitor has a dielectric permittivity $$\varepsilon_0 \varepsilon_{c1} = e^{\left(A + \frac{B}{T} + \frac{C}{T^2}\right)},$$

the first positive temperature coefficient capacitor has a dielectric permittivity $\varepsilon_0 \varepsilon_{c2} = e^{\alpha_1(T-T_C)}$, where T is the temperature of the high side device, $T_C$ is a Curie temperature, $\alpha_1$ is a constant value, A, B and C are Steinhart-Hart coefficients, $\varepsilon_0$ is vacuum permittivity.

By way of example, the second negative temperature coefficient capacitor has a dielectric permittivity $$\varepsilon_0 \varepsilon_{c1} = e^{\left(A + \frac{B}{T} + \frac{C}{T^2}\right)},$$

the second positive temperature coefficient capacitor has a dielectric permittivity $\varepsilon_0 \varepsilon_{c2} = e^{\alpha_1(T-T_C)}$, where T is the temperature of the low side device, $T_C$ is a Curie temperature, $\alpha_1$ is a constant value, A, B and C are Steinhart-Hart coefficients, $\varepsilon_0$ is vacuum permittivity.

Figure 2:
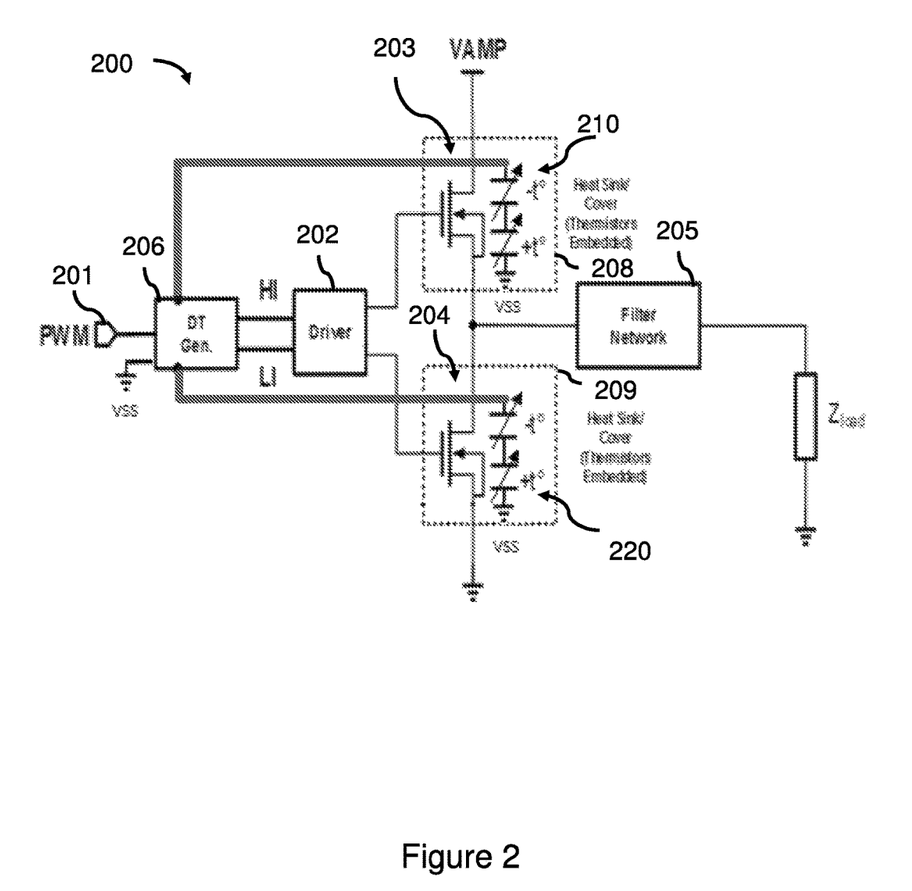
FIG. 2 shows a block diagram of a Class D inverter circuit in a half bridge configuration in accordance with an example embodiment.

FIG. 2 shows a block diagram of a Class D inverter circuit in a half bridge configuration in an example embodiment. One of ordinary skill in the art will appreciate that example embodiments are also applicable with other inverter configurations, such as full bridge configurations.

The circuit 200 includes a pulse width modulator (PWM) input node 201, a dead times generation unit (DT Gen.) 206, a driver 202, a high side device 203 and a low side device 204, a first sensing capacitor 210 and a second sensing capacitor 220. The input of the dead times generation unit 206 connects to the PWM input node 201. The dead times generation unit 206 has a first output HI and a second output LI which connect to the high side device 203 and the low side device 204 via the driver 202 respectively. The driver 202 strengthens the first output HI and the second output LI. By way of example, the high side device 203 and the low side device 204 are N channel transistors. Thus, the first output HI of the dead times generation unit 206 connects to a gate of the high side device 203 via the driver 202, and the second output LI of the dead times generation unit 206 connects to a gate of the low side device 204 via the driver 202. A source voltage (VAMP) connects to a drain of the high side device 203 and a source of the high side device connects to a drain of the low side device 204. A source of the low side device 204 connects to the ground. A node, which is between the source of the high side device 203 and the drain of the low side device 204, connects to a filter network 205 and any impedance load (Zload), e.g. resistor, capacitor, inductor etc.

By way of example, the high side device 203 is enclosed in a heat sink or a cover 208 and the low side device 204 is enclosed in a heat sink or a cover 209. The first sensing capacitor 210 is embedded in the heat sink or the cover 208 and thermally connects to the high side device 203 to sense the temperatures of the high side device 203. The second sensing capacitor 220 is embedded in the heat sink or the cover 209 and thermally connects to the low side device 204 to sense the temperatures of the low side device 204. The dead times generation unit 206 electronically connects to the first sensing capacitor 210 by only one conductor strip and the dead times generation unit 206 electronically connects the second sensing capacitor 220 by only one conductor strip as well.

By way of example, the first sensing capacitor 210 includes a first negative temperature coefficient (NTC) capacitor and a first positive temperature coefficient (PTC) capacitor that are serially connected. The second sensing capacitor 220 includes a second negative temperature coefficient (NTC) capacitor and a second positive temperature coefficient (PTC) capacitor that are serially connected. The dead time generation unit 206, in response to receiving the temperatures from the first sensing capacitor 210 and the second sensing capacitor 220, changes dead times including first dead time intervals for the high side device 203 and second dead time intervals for the low side device 204. The first dead time intervals correspond to dead times before the high side device 203 is turned on and the second dead time intervals correspond to dead times before the low side device 204 is turned on.

By way of example, the dielectric permittivity of the capacitors are respectively:

$$\varepsilon_0 \varepsilon_{C1} = e^{\left(A + \frac{B}{T} + \frac{C}{T^2}\right)} \ (T < T_C)$$
$$\varepsilon_0 \varepsilon_{C2} = e^{\alpha_1 (T - T_C)} \ (T \geq T_C)$$

where A, B and C are Steinhart-Hart (S-H) coefficients, T is the temperature of the sensing capacitor, $T_C$ is the Curie temperature of the sensing capacitor, $\alpha_1$ is a constant value.

Figure 3:
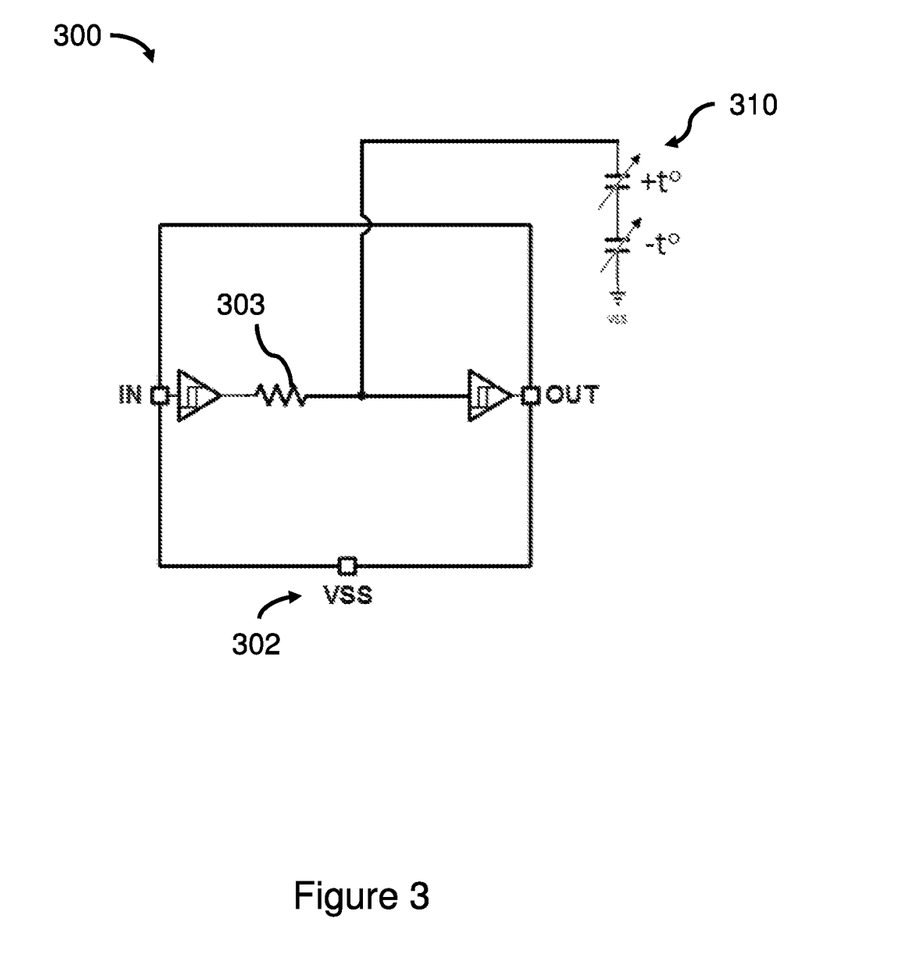
FIG. 3 shows a block diagram for a delay generator in accordance with an example embodiment.

FIG. 3 shows a block diagram for a delay generator 300 in an example embodiment. A sensing capacitor 310 including two types of capacitors is connected between an output of the delay generator 300 and a ground. Since the sensing signal return path can be directly connected to the ground, this way greatly reduces the parasitic inductance of the circuit wiring and prevents gate voltage overshoot and undershoot. The capacitors are selected from a group consisting of a negative temperature coefficient (NTC) capacitor and a positive temperature coefficient (PTC) capacitor. By way of example, at least one NTC capacitor and at least one PTC capacitor are serially connected. A fixed value resistor 303 is connected between an input and the output of the delay generator 300 to create a RC delay circuit. By way of example, since the resistor 302 limits the output voltage for the load, the fixed value resistor 302 can be chosen to have low resistance, e.g. 1 to 5 Ohms. The sensing capacitor 310 is positioned outside the delay generator 300 to thermally connect with the transistors of the inverter circuit for sensing their temperatures. The PTC capacitor performs overheat protection, such overheat is caused by shoot-through or serious switching loss. And the NTC capacitor is used to fine tune the delay time generated from the delay generator 300.

Figure 4:
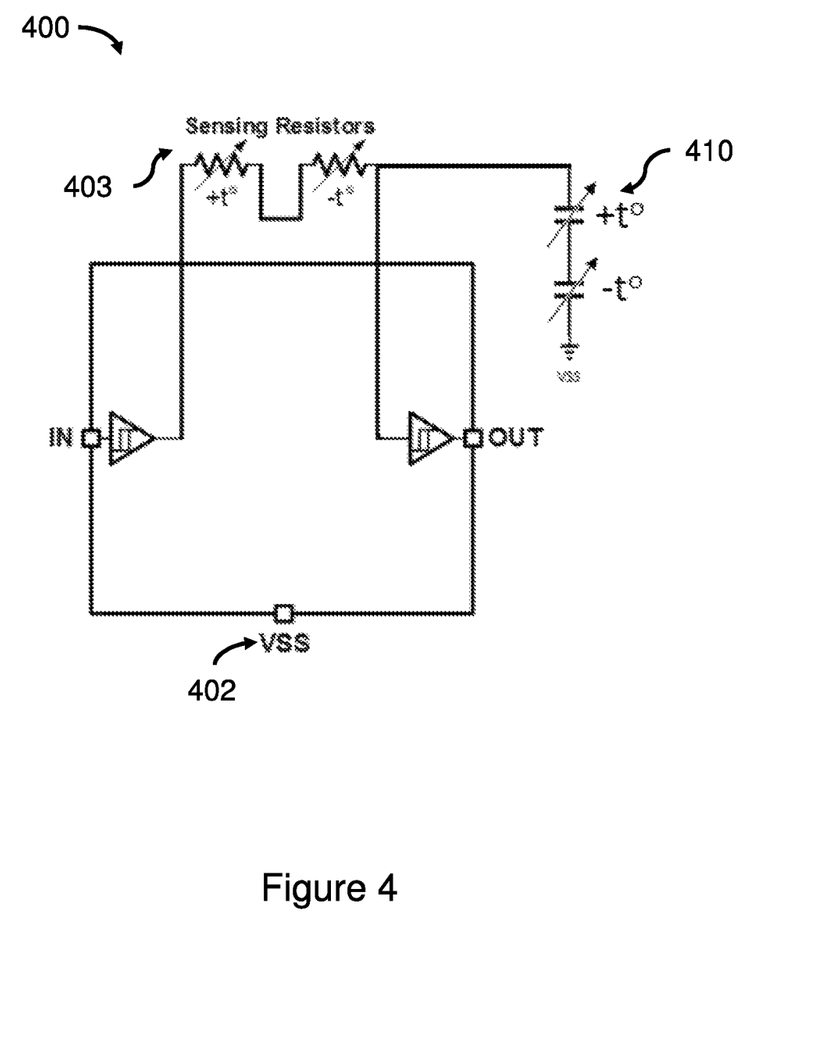
FIG. 4 shows a block diagram for a delay generator accordance with an example embodiment.

FIG. 4 shows a block diagram for a delay generator 400 in an example embodiment to provide flexibility on circuit design. A sensing capacitor 410 including two types of capacitors is connected between an output of the delay generator 400 and a ground. The capacitors are selected from a group consisting of a NTC capacitor and a PTC capacitor. By way of example, at least one NTC capacitor and at least one PTC capacitor are serially connected. A sensing resistor 403 including two types of resistors is connected between an input and the output of the delay generator 400 to create a RC delay circuit. The resistors are selected from a group consisting of a NTC sensor and a PTC sensor. The sensing capacitor 410 and the sensing resistors 403 are located outside the delay generator 400 to thermally connect with the transistors for sensing the temperature. By way of example, at least one NTC sensor and at least one PTC sensor are serially connected. The PTC capacitor and or the PTC sensor performs overheat protection, such overheat is caused by shoot-through or serious switching loss. The NTC capacitor and or the NTC sensor is used to fine tune the delay time generated from the delay generator 400.

Figure 5:
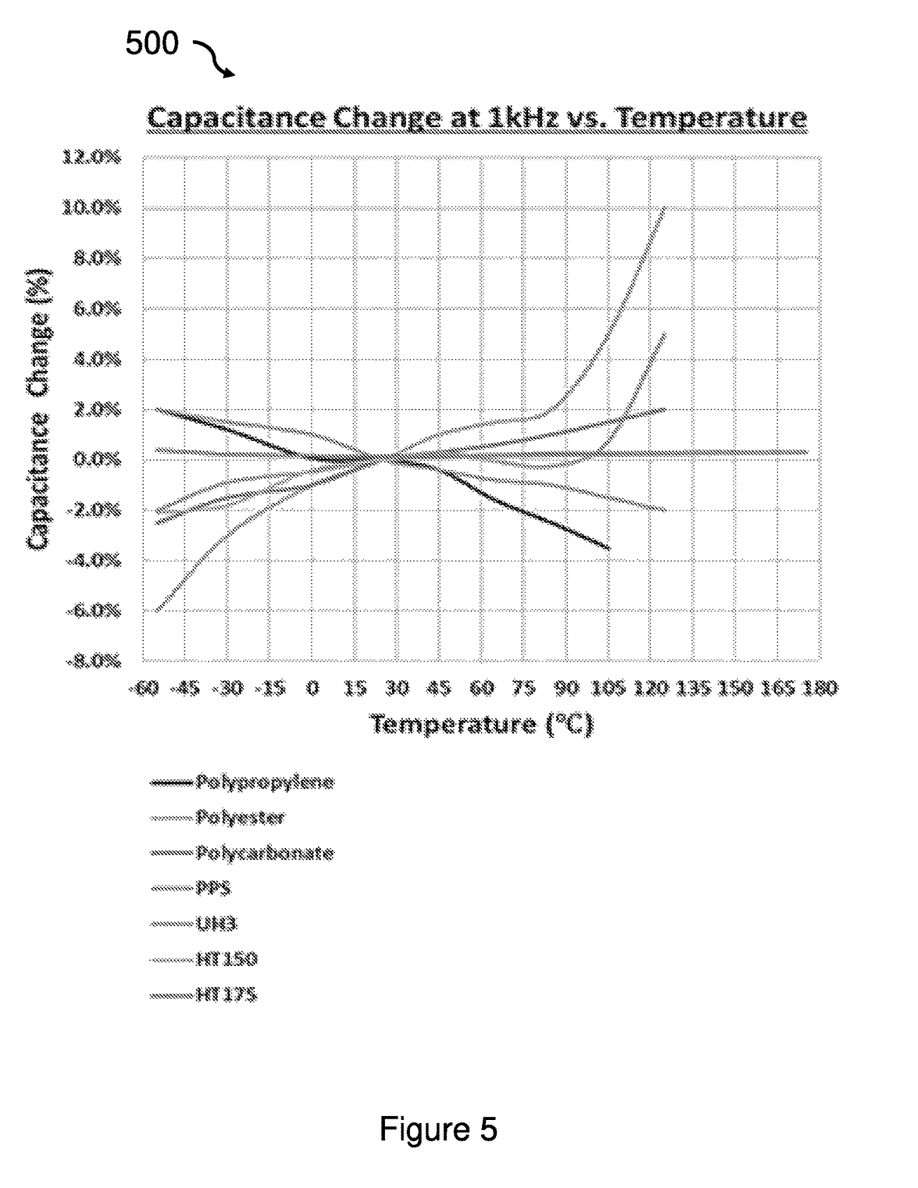
FIG. 5 shows a graph of capacitance change rate in percentage versus temperature for some specific dielectric materials used for the sensing capacitor in accordance with an example embodiment.

FIG. 5 shows a graph 500 illustrating the capacitance change rate in percentage (%) versus temperature (° C.) for some specific dielectric materials used for the sensing capacitor in an example embodiment. These materials have specific temperature behavior and are selected based on the requirement for deadtimes, alone or combined, to construct a positive or a negative temperature coefficient capacitor for the sensing capacitor based on a pre-defined temperature coefficient curve.

Figure 6:
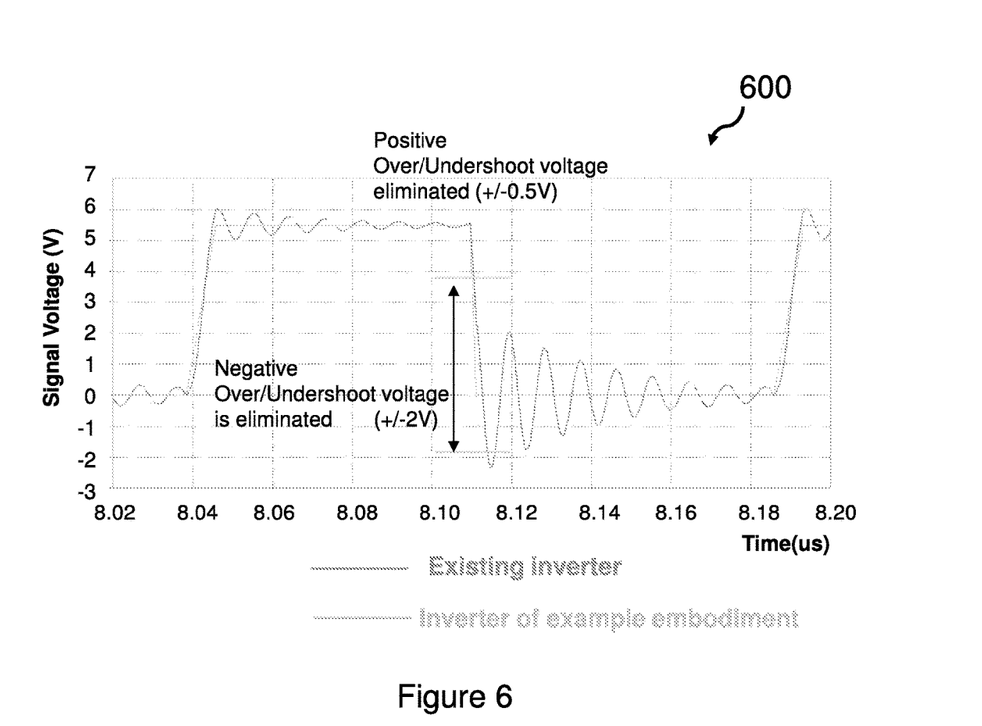
FIG. 6 shows a graph of the signal voltage versus time for the existing inverter and the inverter in accordance with an example embodiment.

FIG. 6 shows a graph 600 of the signal voltage (V) versus time (μs) for the existing inverter and the inverter in accordance with an example embodiment. The printed circuit broad (PCB) trace length of the existing inverter is double the trace length of the inverter of the present invention. As shown in FIG. 6, the present invention greatly eliminates the ringing of the voltage signal. By way of example, the present invention eliminates the negative overshoot and undershoot voltage by 2V and eliminates the positive overshoot and undershoot voltage by 0.5V.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

What is claimed is:
1. A method that prevents overload to input source and reduces parasitic inductance in an inverter circuit with dead-time control, the method comprising:
sensing, with a first sensing capacitor, temperatures of a high side device in the inverter circuit;

sensing, with a second sensing capacitor, temperatures of a low side device in the inverter circuit;

changing, by a first delay generator and in response to receiving the temperatures from the first sensing capacitor, first dead time intervals that correspond to dead times before the high side device is turned on;

changing, by a second delay generator and in response to receiving the temperatures from the second sensing capacitor, second dead time intervals that correspond to dead times before the low side device is turned on; and preventing overload to the input source and reducing parasitic inductance by connecting the first sensing capacitor between an output of the first delay generator and a ground, and connecting the second sensing capacitor between an output of the second delay generator and the ground, wherein the deadtime control includes generating dead times based on the first dead time intervals and the second dead time intervals.

2. The method of claim 1 further comprising:

changing capacitances of the first sensing capacitor in response to sensing the temperatures of the high side device; and changing capacitances of the second sensing resistor in response to sensing the temperatures of the low side device.

3. The method of claim 1 further comprising:

changing first delay times generated from the first delay generator in response to changes in capacitances of the first sensing capacitor; and changing second delay times generated from the second delay generator in response to changes in capacitances of the second sensing capacitor.

4. The method of claim 1, wherein a first fixed value resistor is connected between an input and the output of the first delay generator, and a second fixed value resistor is connected between an input and the output of the second delay generator.

5. The method of claim 1, wherein the first sensing capacitor includes a first negative temperature coefficient capacitor and a first positive temperature coefficient capacitor that are serially connected, the second sensing resistor includes a second negative temperature coefficient capacitor and a second positive temperature coefficient capacitor that are serially connected.

6. The method of claim 5, wherein the first negative temperature coefficient capacitor has a dielectric permittivity $$\varepsilon_0 \varepsilon_{c1} = e^{\left(A + \frac{B}{T} + \frac{C}{T^2}\right)},$$

the first positive temperature coefficient capacitor has a dielectric permittivity $\varepsilon_0 \varepsilon_{c2} = e^{\alpha_1(T-T_C)}$, where T is the temperatures of the high side device, $T_C$ is a Curie temperature, $\alpha_1$ is a constant value, A, B and C are Steinhart-Hart coefficients, $\varepsilon_0$ is vacuum permittivity.

7. The method of claim 1 further comprising:

connecting the first delay generator with the first sensing capacitor by one conductor strip only, and connecting the second delay generator with the second sensing capacitor by one conductor strip only.

8. An inverter circuit that prevents overload to input source and reduces parasitic inductance in the inverter circuit, comprising:

a first sensing capacitor that is thermally connected to a high side device in the inverter circuit;

a second sensing capacitor that is thermally connected to a low side device in the inverter circuit;

a dead times generation unit that prevents shoot-through currents and reduces body-diode conduction time by generating dead times including first dead time intervals and second dead time intervals for the high side device and the low side device respectively and includes:

a first delay generator that changes the first dead time intervals, wherein the first sensing capacitor is connected between an output of the first delay generator and a ground; and a second delay generator that changes the second dead time intervals, wherein the second sensing capacitor is connected between an output of the second delay generator and the ground, wherein the first dead time intervals correspond to dead times before the high side device is turned on, and the second dead time intervals that correspond to dead times before the low side device is turned on.

9. The inverter circuit of claim 8, wherein a first fixed value resistor is connected between an input and the output of the first delay generator; and a second fixed value resistor is connected between an input and the output of the second delay generator.

10. The inverter circuit of claim 8, wherein the first delay generator electronically connects to the first sensing capacitor by only one conductor strip, and the second delay generator electronically connects to the second sensing capacitor by only one conductor strip.

11. The inverter circuit of claim 8, wherein the first sensing capacitor includes a first negative temperature coefficient capacitor and a first positive temperature coefficient capacitor that are serially connected, the second sensing resistor includes a second negative temperature coefficient capacitor and a second positive temperature coefficient capacitor that are serially connected.

12. The inverter circuit of claim 11, wherein the second negative temperature coefficient capacitor has a dielectric permittivity $$\varepsilon_0 \varepsilon_{c1} = e^{\left(A + \frac{B}{T} + \frac{C}{T^2}\right)},$$

the second positive temperature coefficient capacitor has a dielectric permittivity $\varepsilon_0 \varepsilon_{c2} = e^{\alpha_1(T-T_C)}$, where T is the temperature of the second sensing capacitor, $T_C$ is a Curie temperature, $\alpha_1$ is a constant value, A, B and C are Steinhart-Hart coefficients, $\varepsilon_0$ is vacuum permittivity.

13. The inverter circuit of claim 8, wherein the inverter circuit is a Class-D half bridge circuit.

14. The inverter circuit of claim 8, wherein the inverter circuit is a Class-D full bridge circuit.

15. The inverter circuit of claim 8, wherein the high side device and the low side device are selected from a group consisting of enhancement mode GaN, GaN power transistors and silicon MOSFET.

16. A method that prevents overload to input source and reduces parasitic inductance in an inverter circuit with deadtime control, the method comprising:

sensing temperatures of at least one high side device in the inverter circuit and temperatures of at least one low side device in the inverter circuit;

changing, with at least one dead times generation unit and in response to receiving the temperatures of the at least one high side device and the temperatures of the at least one low side device, first dead time intervals that correspond to dead times before the at least one high side device is turned on and second dead time intervals that correspond to dead times before the at least one low side device is turned on; and preventing shoot-through currents and reducing body-diode conduction time by operating the inverter circuit with dead times within a maximum dead time and a minimum dead time, wherein the maximum dead time depends on a capacitance of at least one sensing capacitor at a rated temperature and the minimum dead time depends on the capacitance of the at least one sensing capacitor at Curie temperature.

17. The method of claim 16 further comprising:

changing capacitances of a first sensing capacitor in response to sensing the temperatures of the at least one high side device;

changing capacitances of a second sensing capacitor in response to sensing the temperatures of the at least one low side device;

generating first delay times generated from a first delay generator in response to changes in the capacitances of the first sensing capacitor; and generating second delay times generated from a second delay generator in response to changes in the capacitances of the second sensing capacitor, wherein the first sensing capacitor is connected between an output of the first delay generator and a ground; the second sensing capacitor is connected between an output of the second delay generator and the ground.

18. The method of claim 17 further comprising:

connecting a first fixed value resistor between an input and the output of the first delay generator, and connecting a second fixed value resistor between an input and the output of the second delay generator.

19. The method of claim 16, wherein the at least one sensing capacitor includes a negative temperature coefficient capacitor and a positive temperature coefficient capacitor that are serially connected, wherein the negative temperature coefficient sensor is a capacitor that has a dielectric permittivity $$\varepsilon_0 \varepsilon_{c1} = e^{\left(A + \frac{B}{T} + \frac{C}{T^2}\right)}$$

and the positive temperature coefficient sensor is a capacitor that has a dielectric permittivity $\varepsilon_0 \varepsilon_{c2} = e^{\alpha_1(T - T_C)}$, where T is the temperature of the at least one sensing resistor, $T_C$ is a Curie temperature, $\alpha_1$ is a constant value, A, B and C are Steinhart-Hart coefficients, $\varepsilon_0$ is vacuum permittivity.

20. The method of claim 16 further comprising:

connecting the at least one dead times generation unit to the at least one sensing capacitor by only one conductor strip.

* * * * *